United States Patent
Yen et al.

(10) Patent No.: US 12,112,878 B2
(45) Date of Patent: Oct. 8, 2024

(54) ASYMMETRIC SPIRAL INDUCTOR

(71) Applicant: REALTEK SEMICONDUCTOR CORPORATION, Hsinchu (TW)

(72) Inventors: Hsiao-Tsung Yen, Hsinchu (TW); Ka-Un Chan, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 474 days.

(21) Appl. No.: 17/105,677

(22) Filed: Nov. 27, 2020

(65) Prior Publication Data

US 2021/0175006 A1 Jun. 10, 2021

(30) Foreign Application Priority Data

Dec. 9, 2019 (TW) .................................. 108144873

(51) Int. Cl.
*H01F 27/28* (2006.01)
*H01L 23/52* (2006.01)
*H01L 23/522* (2006.01)

(52) U.S. Cl.
CPC ..... *H01F 27/2804* (2013.01); *H01L 23/5227* (2013.01)

(58) Field of Classification Search
CPC ......... H01F 17/0013; H01F 2017/0073; H01F 27/2804; H01F 17/0006; H01F 2027/2809;

(Continued)

(56) References Cited

U.S. PATENT DOCUMENTS

| 4,613,843 A | 9/1986 | Esper et al. |
| 6,429,504 B1 * | 8/2002 | Beaussart ........... H01L 23/5227 257/E21.022 |

(Continued)

FOREIGN PATENT DOCUMENTS

| CN | 101145435 A | 3/2008 |
| CN | 109860146 A | 6/2019 |
| JP | 2001060515 A | 3/2001 |

OTHER PUBLICATIONS

OA letter of (U.S. Appl. No. 15/972,645) mailed on Nov. 23, 2020.

(Continued)

*Primary Examiner* — Malcolm Barnes
(74) *Attorney, Agent, or Firm* — WPAT, P.C

(57) ABSTRACT

An asymmetric spiral inductor is provided. The asymmetric spiral inductor includes a first winding, a second winding and a third winding. The first winding has a first end and a second end and is implemented in the ultra-thick metal (UTM) layer of a semiconductor structure. The second winding, which has a third end and a fourth end, is implemented in the re-distribution layer of the semiconductor structure and has a first maximum trace width. The third winding, which has a fifth end and a sixth end, is implemented in the UTM layer of the semiconductor structure and has a second maximum trace width smaller than the first maximum trace width. The second and third ends are connected through a first through structure, the fourth and fifth ends are connected through a second through structure, and the first and sixth ends are the two ends of the asymmetric spiral inductor.

20 Claims, 17 Drawing Sheets

(58) Field of Classification Search
CPC .............. H01F 2017/0046; H01F 27/29; H01F 2017/0086; H01F 2017/002; H01F 2017/008; H01L 23/5227
See application file for complete search history.

(56) References Cited

U.S. PATENT DOCUMENTS

| | | | | |
|---|---|---|---|---|
| 7,262,681 B2* | 8/2007 | Hurley | ................. | H03H 7/0107 336/200 |
| 7,626,480 B2* | 12/2009 | Lee | ..................... | H01F 17/0013 336/200 |
| 7,701,036 B2* | 4/2010 | Lee | ..................... | H01L 23/5227 257/E21.022 |
| 8,054,155 B2* | 11/2011 | Raczkowski | ....... | H01F 27/2804 336/200 |
| 8,441,333 B2* | 5/2013 | Chiu | ................... | H01L 23/5227 336/200 |
| 8,704,627 B2* | 4/2014 | Kuroda | ............... | H01L 25/0657 336/200 |
| 10,283,257 B2* | 5/2019 | Kim | ..................... | H01F 27/2804 |
| 2011/0309907 A1* | 12/2011 | Kuroda | ............... | H01L 23/5225 336/222 |
| 2015/0130579 A1* | 5/2015 | Kim | ........................ | H01F 41/06 336/200 |
| 2017/0162318 A1* | 6/2017 | Yen | ......................... | H01L 28/10 |
| 2018/0366254 A1* | 12/2018 | Jean | ..................... | H01L 23/5227 |
| 2019/0214175 A1* | 7/2019 | Yen | ......................... | H01F 41/06 |
| 2022/0399270 A1* | 12/2022 | Vanukuru | ........... | H01L 23/5283 |

OTHER PUBLICATIONS

OA letter of the counterpart CN application (appl. No. 201911294586.6) mailed on May 18, 2022. Summary of the OA letter: Claims 1~9 are rejected under Chinese Patent Act §22-3 as being obvious by D2(CN101145435A).

OA letter of the counterpart CN application (appl. No. 201911294586.6) mailed on Nov. 1, 2021. Summary of the OA letter: Claims 1~10 are rejected under Chinese Patent Act §22-3 as being obvious by D1(CN109860146A).

* cited by examiner

100

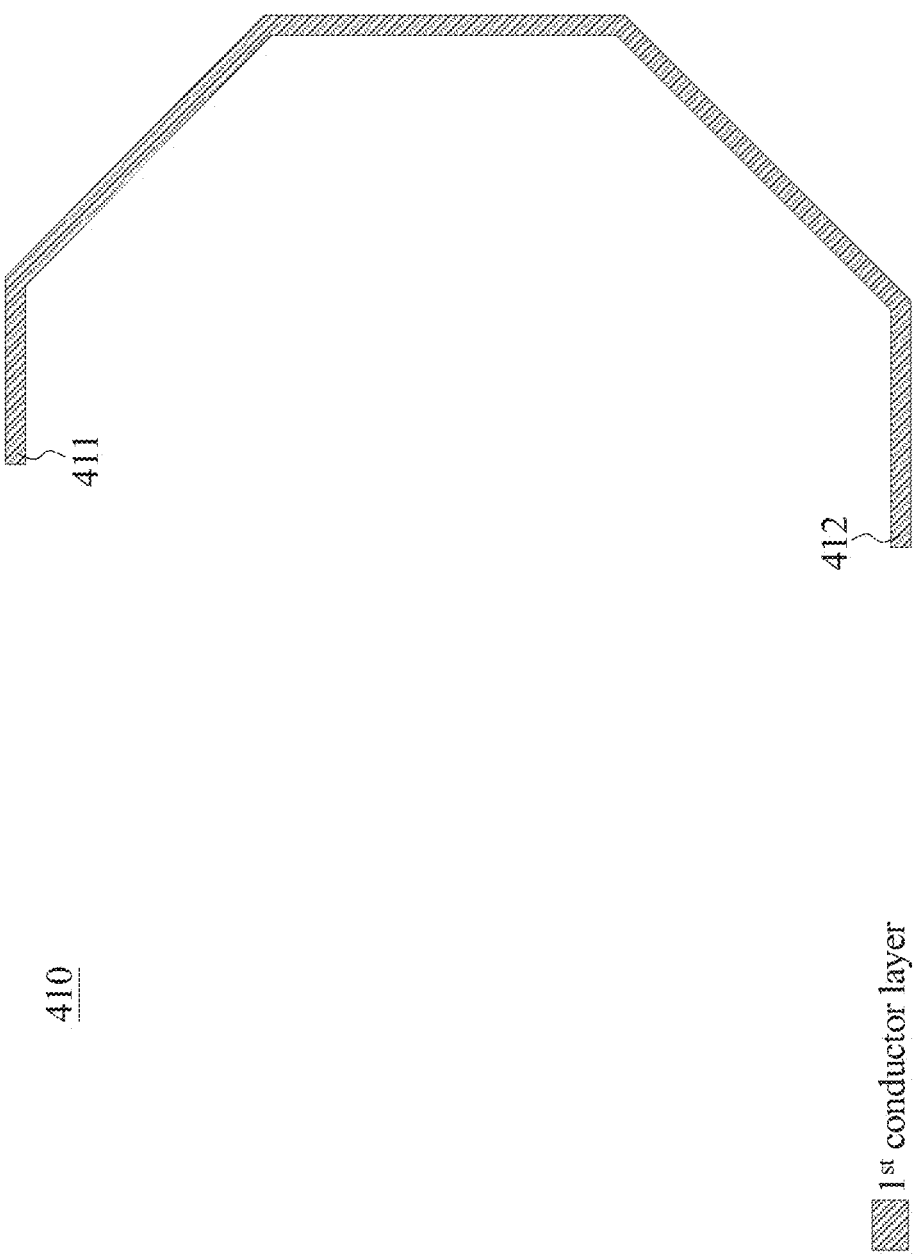

ASYMMETRIC SPIRAL INDUCTOR

BACKGROUND OF THE INVENTION

1. Field of the Invention

The present invention generally relates to integrated inductors, and, more particularly, to asymmetric spiral integrated inductors.

2. Description of Related Art

FIG. 1 and FIG. 2 respectively show an asymmetric spiral inductor and a symmetric spiral inductor of conventional types. The asymmetric spiral inductor 100 and the symmetric spiral inductor 200 are planar structures. The symmetric spiral inductor 200 is mainly made up of conductor segments in two conductor layers, which are respectively represented in gray and black. The conductor segments in different conductor layers are connected by through structures 105, such as a via structure or a via array in a semiconductor process. In general, the symmetric spiral inductor 200 is suitable for differential signals because it is symmetric in structure, while the asymmetric spiral inductor 100 is suitable for single-ended signals.

One of the approaches to increase the inductance value of the asymmetric spiral inductor 100 and the symmetric spiral inductor 200 is to increase their numbers of turns. In addition to an increase in the area of the asymmetric spiral inductor 100 and the symmetric spiral inductor 200, the increase in the numbers of turns results in increases in parasitic series resistance and parasitic capacitance as well. High parasitic series resistance and parasitic capacitance cause the self-resonant frequency and the quality factor Q of the asymmetric spiral inductor 100 and the symmetric spiral inductor 200 to decrease. In addition, metal loss and substrate loss are also key factors that affect the quality factor Q. Metal loss is due to the resistance of the metal itself. There are two reasons for substrate loss. The first reason is that when the inductor is in operation, a time-varying electric displacement between the metal coil of the inductor and the substrate is generated; this electric displacement results in a displacement current between the metal coil and the substrate, and this displacement current penetrates into the substrate of low impedance, thereby causing energy loss. The displacement current is associated with the coil area of the inductor. The larger the area, the larger the displacement current. The second reason is that the time-varying electromagnetic field of the inductor penetrates through the dielectric and generates a magnetically induced eddy current on the substrate. The magnetically induced eddy current and the inductor current are opposite in directions, resulting in energy loss.

When the inductor is operated at low frequencies, the current in the metal coil is evenly distributed. In this case, the metal loss at low frequencies is due to the series resistance of the metal coil. When the inductor is operated at high frequencies, the metal coil closer to the inner turns generates stronger magnetic field; a strong magnetic field induces eddy currents in the inner turns of the metal coil. The eddy currents cause uneven distribution of currents—most of the currents are pushed to the surface of the metal coil; this phenomenon is known as the skin effect. Because the currents pass through a smaller metal cross section in the skin effect, the currents encounter a greater resistance, thereby resulting in decrease in the quality factor Q.

Therefore, it is important in the art to improve the quality factor Q and the inductance value of the inductor without increasing the inductor area.

SUMMARY OF THE INVENTION

In view of the issues of the prior art, an object of the present invention is to provide asymmetric spiral inductors, so as to make an improvement to the prior art.

An asymmetric spiral inductor is provided. The asymmetric spiral inductor includes a first winding, a second winding and a third winding. The first winding has a first end and a second end and is implemented in an ultra-thick metal (UTM) layer of a semiconductor structure. The second winding, which has a third end and a fourth end, is implemented in a re-distribution layer (RDL) of the semiconductor structure and has a first maximum trace width. The third winding, which has a fifth end and a sixth end, is implemented in the UTM layer of the semiconductor structure and has a second maximum trace width smaller than the first maximum trace width. The second end and the third end are connected through a first through structure, the fourth end and the fifth end are connected through a second through structure, and the first end and the sixth end are two ends of the asymmetric spiral inductor.

An asymmetric spiral inductor is provided. The asymmetric spiral inductor includes a spiral coil, a first trace and a second trace. The spiral coil has a first end and a second end and is implemented in a first conductor layer of a semiconductor structure. The first trace has a third end and a fourth end and is implemented in a second conductor layer of the semiconductor structure. The first conductor layer is different from the second conductor layer, and a length of the first trace is less than one turn of the spiral coil. The second trace has a fifth end and a sixth end and is implemented in the first conductor layer of the semiconductor structure. The second end and the third end are connected through a first through structure, the fourth end and the fifth end are connected through a second through structure, and the first end and the sixth end are two ends of the asymmetric spiral inductor.

The asymmetric spiral inductors of the present invention are implemented in two different conductor layers in a semiconductor structure. In comparison with the traditional technology, the present invention can increase the inductance value of the asymmetric spiral inductors without increasing the inductor area, and, therefore, the quality factor Q is improved.

These and other objectives of the present invention no doubt become obvious to those of ordinary skill in the art after reading the following detailed description of the preferred embodiments with reference to the various figures and drawings.

BRIEF DESCRIPTION OF THE DRAWINGS

FIG. 4A shows the winding 410 of FIG. 3B.

DETAILED DESCRIPTION OF THE EMBODIMENTS

The following description is written by referring to terms of this technical field. If any term is defined in this specification, such term should be interpreted accordingly.

The disclosure herein includes asymmetric spiral inductors. On account of that some or all elements of the asymmetric spiral inductors could be known, the detail of such elements is omitted provided that such detail has little to do with the features of this disclosure, and that this omission nowhere dissatisfies the specification and enablement requirements. A person having ordinary skill in the art can choose components equivalent to those described in this specification to carry out the present invention, which means that the scope of this invention is not limited to the embodiments in the specification.

Figure 1:
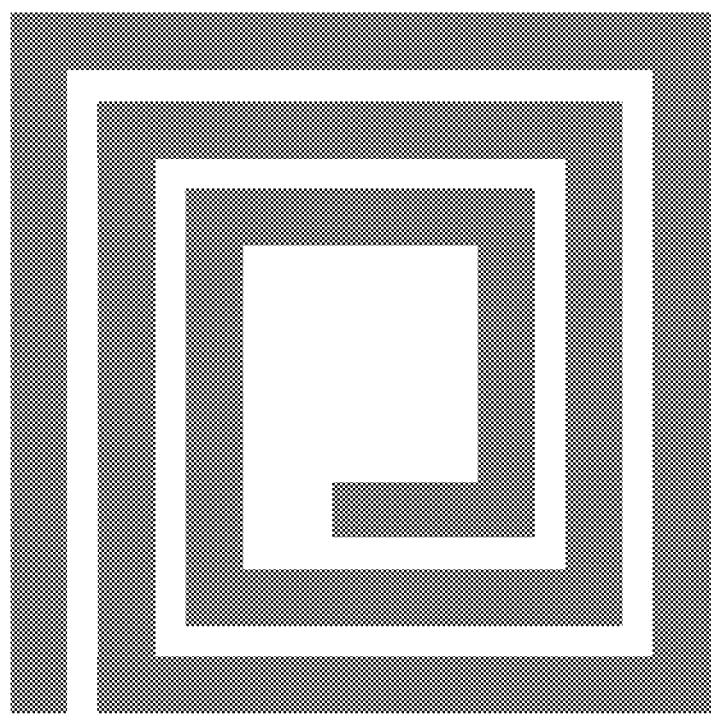
FIG. 1 is a conventional asymmetric spiral inductor.
Figure 2:
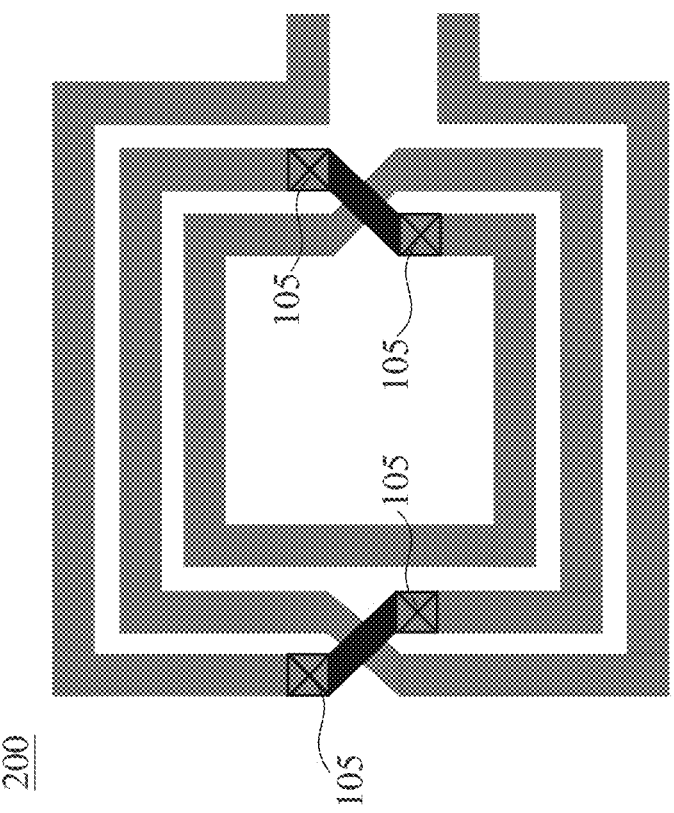
FIG. 2 is a conventional symmetric spiral inductor.
Figure 3A:
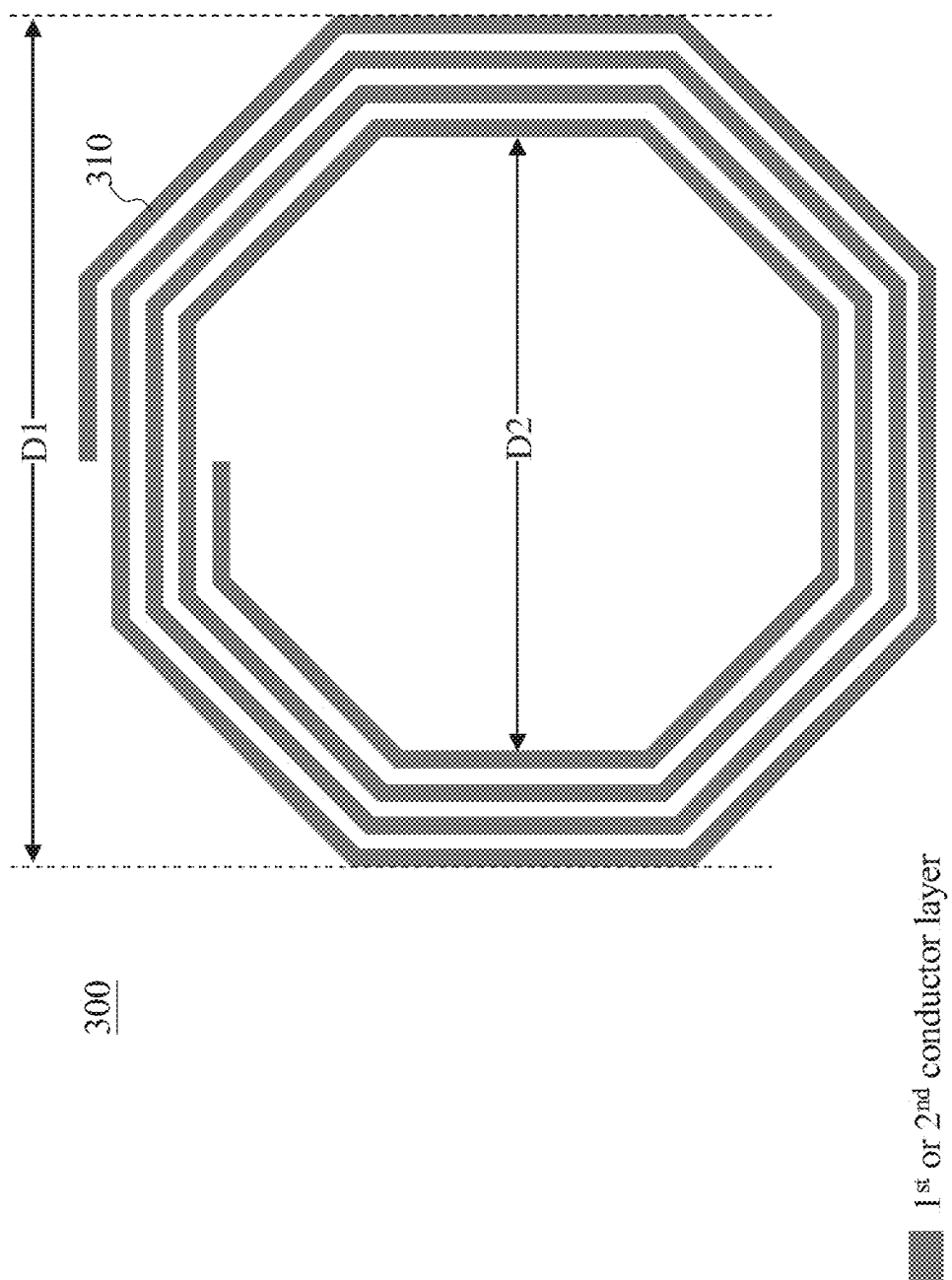
FIG. 3A shows an illustrative four-turn asymmetric spiral inductor.
Figure 3B:
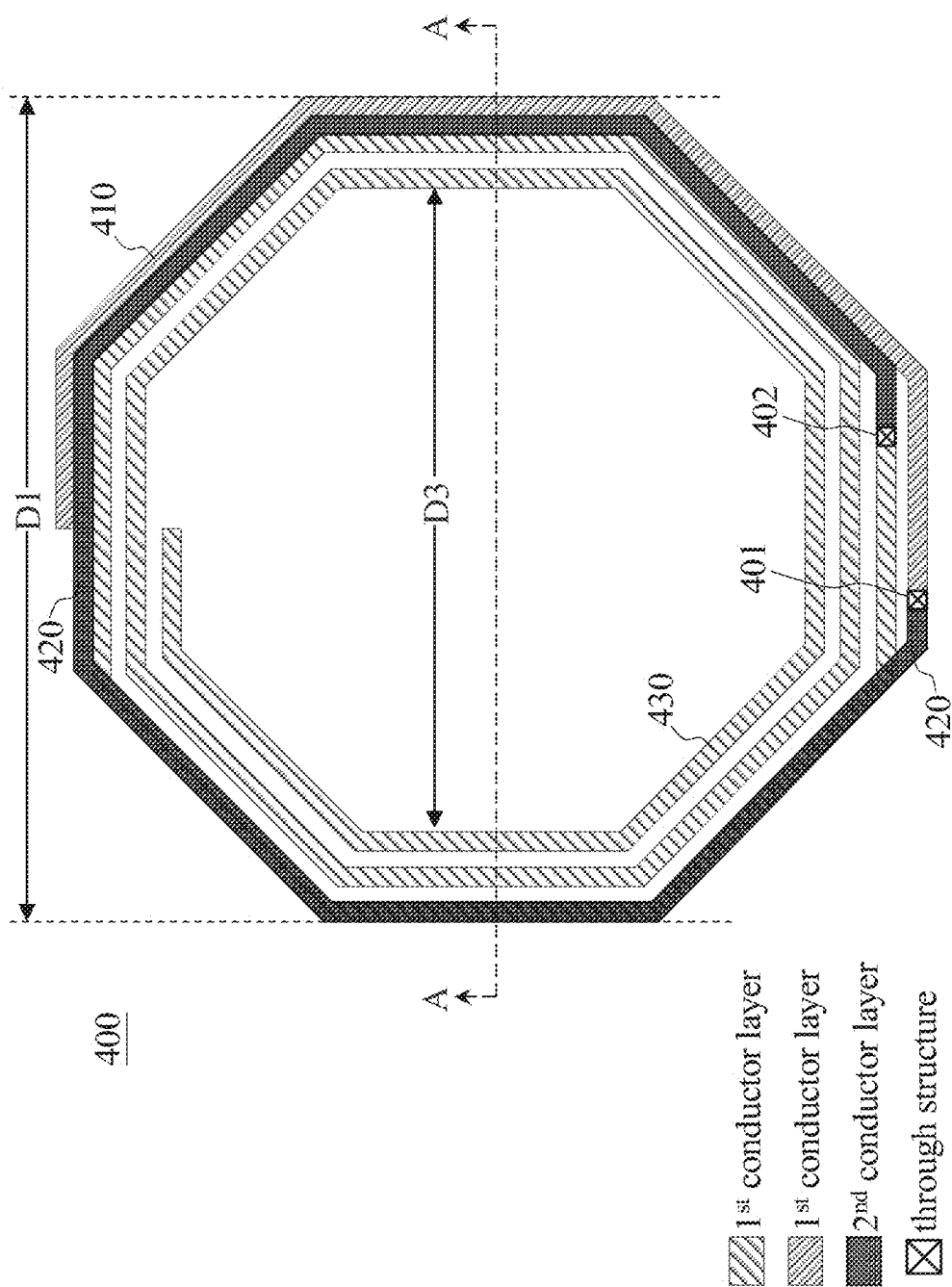
FIG. 3B shows another illustrative four-turn asymmetric spiral inductor.

FIGS. 3A and 3B each show a top view or a bottom view of a four-turn asymmetric spiral inductor. The asymmetric spiral inductor 300 of FIG. 3A is implemented in the first conductor layer or the second conductor layer of the semiconductor structure, and the asymmetric spiral inductor 400 of FIG. 3B is implemented in the first conductor layer and the second conductor layer of the semiconductor structure. The first conductor layer and the second conductor layer can be any two different conductor layers of the semiconductor structure. For example, the first conductor layer can be one of the ultra-thick metal (UTM) layer and the re-distribution layer (RDL), and the second conductor layer is the other.

As shown in FIG. 3A, the asymmetric spiral inductor 300 is formed by a single winding 310. In other words, the winding 310 itself is the asymmetric spiral inductor 300. The winding 310 can be regarded as being formed by or made up of a single trace.

As shown in FIG. 3B, the asymmetric spiral inductor 400 is formed by three windings: the winding 410, the winding 420 and the winding 430. The winding 410 and the winding 430 are implemented in the first conductor layer, and the winding 420 is implemented in the second conductor layer. The winding 410, the winding 420 and the winding 430 are connected via the through structure 401 and the through structure 402. More specifically, the through structure 401 connects one end of the winding 420 with the winding 410, and the through structure 402 connects the other end of the winding 420 with the winding 430. The winding 420 extends along the edge of the asymmetric spiral inductor 400 or the winding 430. As a result, the shape of the winding 420 is similar to a part of the contour of the asymmetric spiral inductor 400 and/or the winding 430.

As shown in FIGS. 3A and 3B, the asymmetric spiral inductor 300 and the asymmetric spiral inductor 400 are both four-turn spiral inductors, but differ in that the entire trace of the asymmetric spiral inductor 300 is implemented in the same conductor layer, whereas most of the traces of the asymmetric spiral inductor 400 are implemented in the first conductor layer and some of the traces of the asymmetric spiral inductor 400 (i.e., the winding 420) are implemented in the second conductor layer. In other words, the asymmetric spiral inductor 300 is a planar structure, and the asymmetric spiral inductor 400 is a three-dimensional structure. As a result, under the premise of having the same number of turns and the same outer diameter D1 (i.e., under the premise that the areas of the two inductors are substantially the same), the inner diameter D3 of the asymmetric spiral inductor 400 is larger than the inner diameter D2 of the asymmetric spiral inductor 300, causing the quality factor Q of the asymmetric spiral inductor 400 to be higher than the quality factor Q of the asymmetric spiral inductor 300.

Figure 4B:
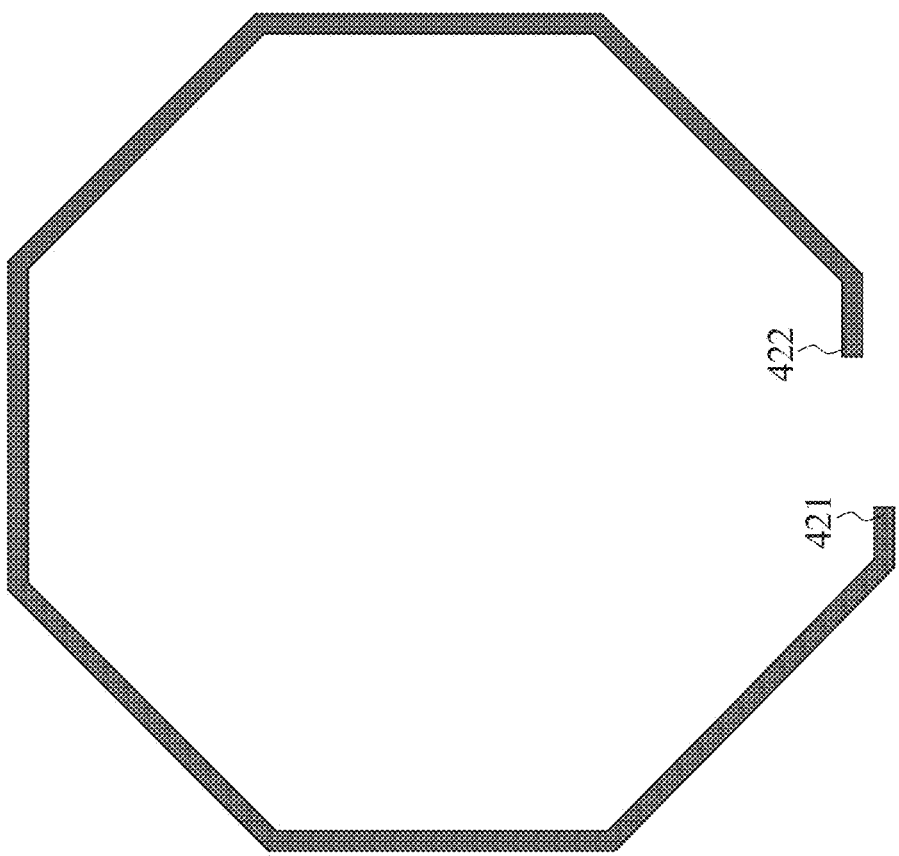
FIG. 4B shows the winding 420 of FIG. 3B.
Figure 4C:
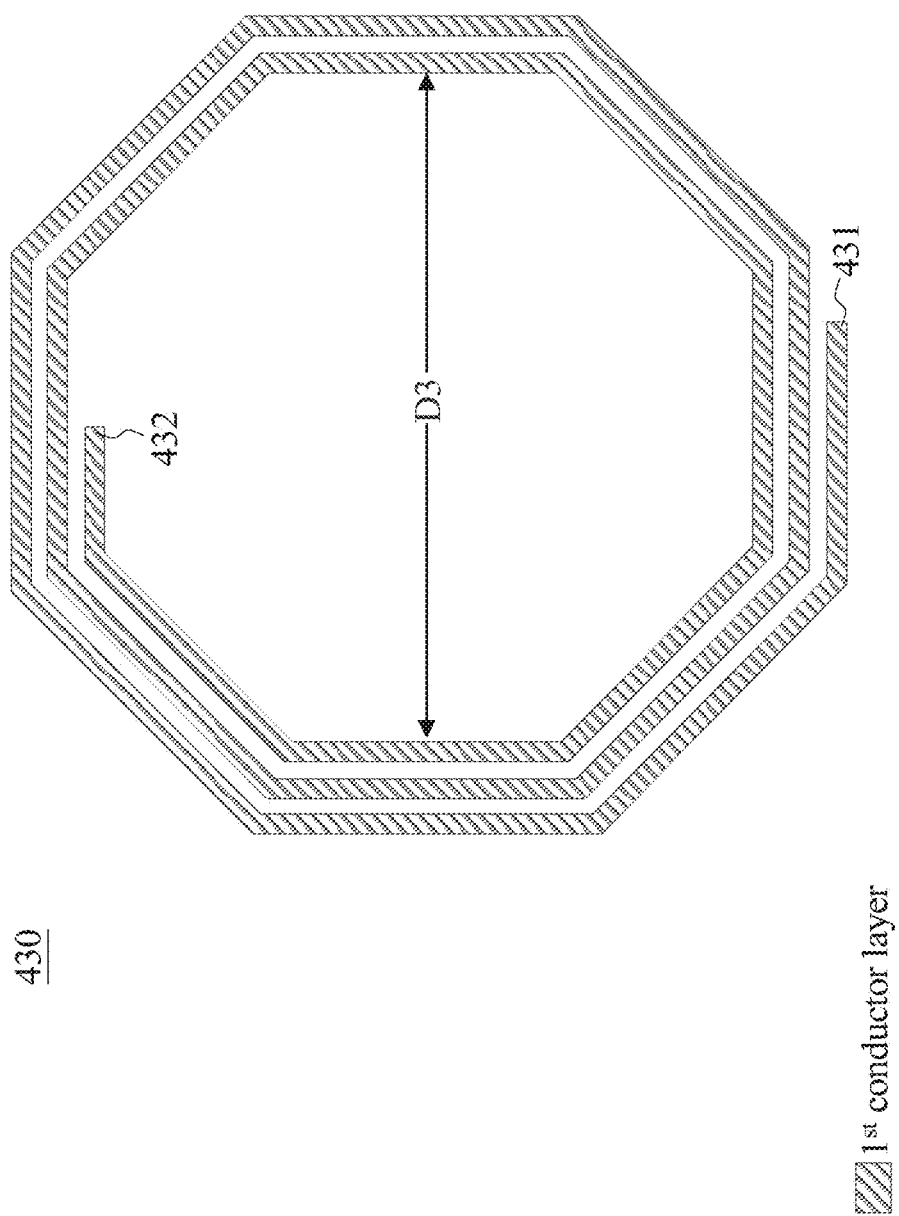
FIG. 4C shows the winding 430 of FIG. 3B.

FIGS. 4A, 4B and 4C show the winding 410, the winding 420 and the winding 430, respectively. The winding 410 is a trace or a coil whose length is approximately a half turn of the asymmetric spiral inductor 400. The winding 420 is a trace or a coil whose length is approximately one turn of the asymmetric spiral inductor 400. The winding 430 forms an asymmetric spiral coil. The two ends of the winding 410 are the end 411 and the end 412, the two ends of the winding 420 are the end 421 and the end 422, and the two ends of the winding 430 are the end 431 and the end 432. The end 411 is one of the ends of the asymmetric spiral inductor 400, the end 412 is connected to the end 421 via the through structure 401, the end 422 is connected to the end 431 via the through structure 402, and the end 432 is the other end of the asymmetric spiral inductor 400. In this embodiment, the length of the trace of the winding 410 is approximately a half turn of the asymmetric spiral inductor 400 or the winding 430, but, in other embodiments, the length can be longer (e.g., ¾ turn, one turn or multiple turns) or shorter (e.g., less than or equal to ¼ turn). In this embodiment, the length of the trace of the winding 420 is approximately one turn of the asymmetric spiral inductor 400 or the winding 430, but, in other embodiments, the length can be longer (e.g., 1.5 turns or more) or shorter (e.g., less than one turn). In this embodiment, the winding 430 is a multi-turn structure, preferably greater than or equal to one turn.

Figure 5:
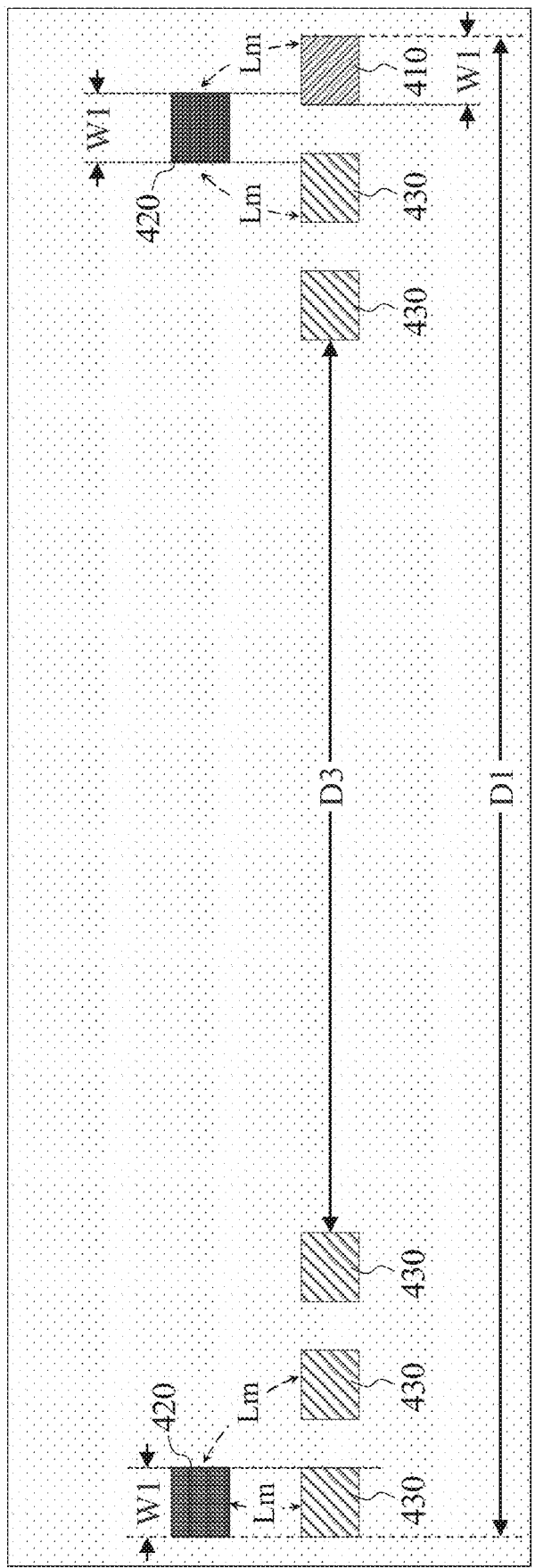
FIG. 5 shows the cross-sectional side view A-A of FIG. 3B according to an embodiment.

FIG. 5 shows the cross-sectional side view A-A of FIG. 3B according to one embodiment. In this embodiment, the widths of the traces of the windings 410, 420 and 430 are all W1. On the left side of the figure, a part of the trace of the winding 420 completely or partially overlaps with a part of the trace of the winding 430, and on the right side of the figure, a part of the trace of the winding 420 partially overlaps with a part of the trace of the winding 410 and with a part of the trace of the winding 430. There is mutual inductance Lm between the winding 420 and its adjacent winding 410 and/or winding 430.

Figure 6:
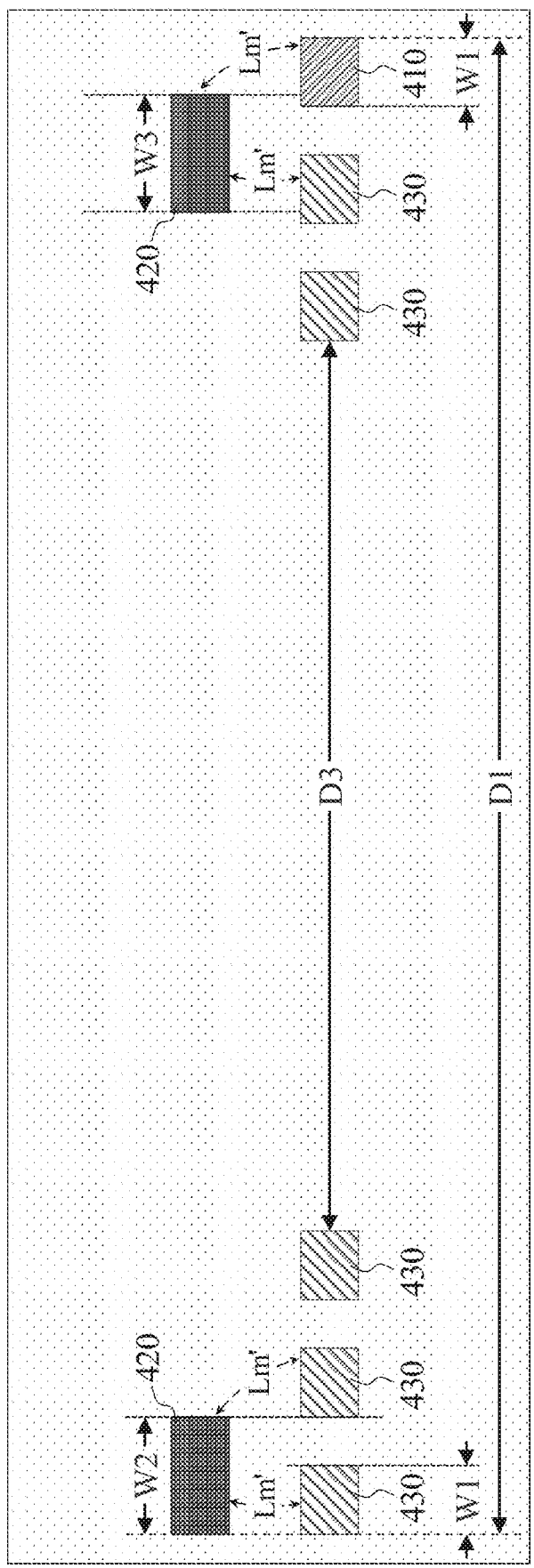
FIG. 6 shows the cross-sectional side view A-A of FIG. 3B according to another embodiment.

FIG. 6 shows the cross-sectional side view A-A of FIG. 3B according to another embodiment. In this embodiment, the widths of the traces of the winding 410 and the winding 430 are both W1 (in other words, the maximum trace width of the winding 410 and the winding 430 is W1), and the maximum trace width of the winding 420 is W2 or W3. When W2 is the same as W3, the trace of the winding 420 is uniform in width. When W2 is different from W3, the width of the trace of the winding 420 is not uniform. Compared to FIG. 5, because the overlap between the winding 420 and the winding 410 and/or the winding 430 becomes larger (i.e., W2 and/or W3 being greater than W1), the mutual inductance Lm' between the winding 420 and the winding(s) 410 and/or 430 is greater than the mutual inductance Lm of FIG. 5. In other words, compared to the embodiment of FIG. 5, the inductor of FIG. 6 has a higher inductance value.

Typically, the unit resistance value of the RDL is greater than that of the UTM layer. Thus, when the first conductor layer is the UTM layer and the second conductor layer is the RDL, the larger width(s) W2 and/or W3 (compared to W1) can lead to a lower resistance value of the winding 420. Therefore, despite being implemented in a conductor layer of a larger unit resistance value, the overall resistance value of the winding 420 may not become larger (compared to the resistance value when the winding 420 is implemented in the UTM layer and has a width of W1) due to the increase in the trace width.

Figure 7:
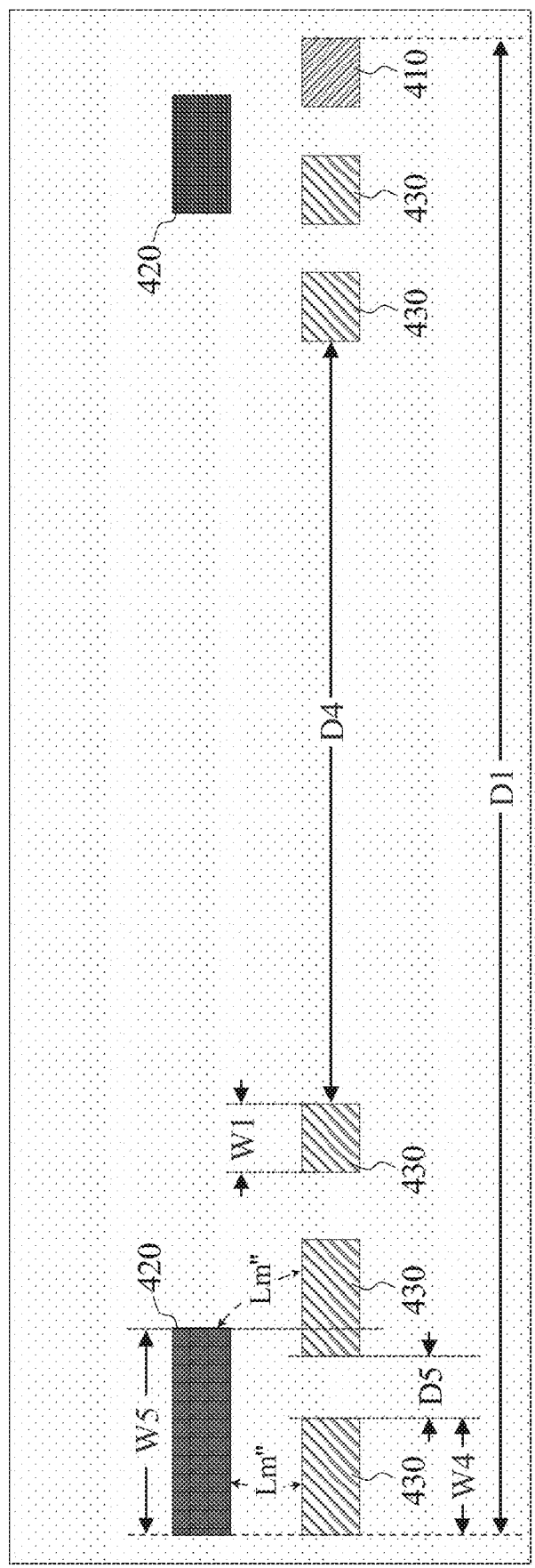
FIG. 7 shows the cross-sectional side view A-A of FIG. 3B according to another embodiment.

FIG. 7 shows another embodiment of the cross-sectional side view A-A of FIG. 3B. Of the trace of the winding 430, the part that overlaps or partially overlaps with the winding 420 may have a larger width than the part that does not overlap with the winding 420 (i.e., W4>W1); therefore, the mutual inductance Lm" between the winding 420 and the winding 430 is greater than the mutual inductance Lm' of the embodiment of FIG. 6. In some embodiments, the winding 420 and the winding 430 may overlap by more than one turn, for example, by two turns or more. In other words, compared to the embodiment of FIG. 6, the inductor of FIG. 7 has a higher inductance value. The outer diameter of the inductor of FIG. 7 is the same as the outer diameter of the inductor of FIG. 6 (both D1), but the inner diameter D4 of the inductor of FIG. 7 is smaller than the inner diameter D3 of the inductor of FIG. 6 because the trace of a part of the winding 430 in FIG. 7 is wider. In the embodiment of FIG. 7, the width W5 of a part of the trace of the winding 420 is greater than the sum of the width W4 of a part of the trace of the winding 430 and the spacing D5 between two adjacent turns of the winding 430.

Figure 8A:
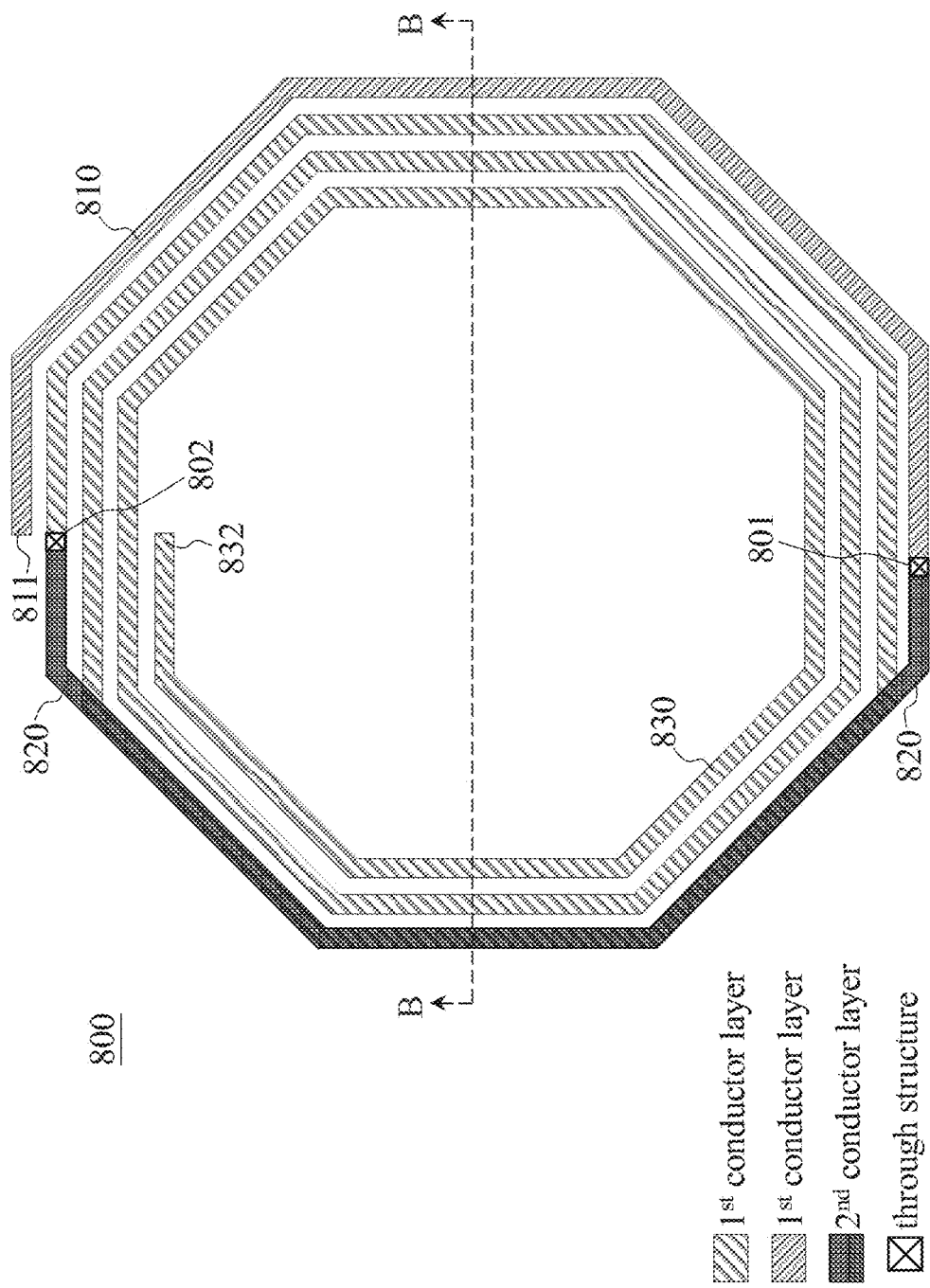
FIG. 8A shows an illustrative asymmetric spiral inductor according to another embodiment of the present invention.
Figure 8B:
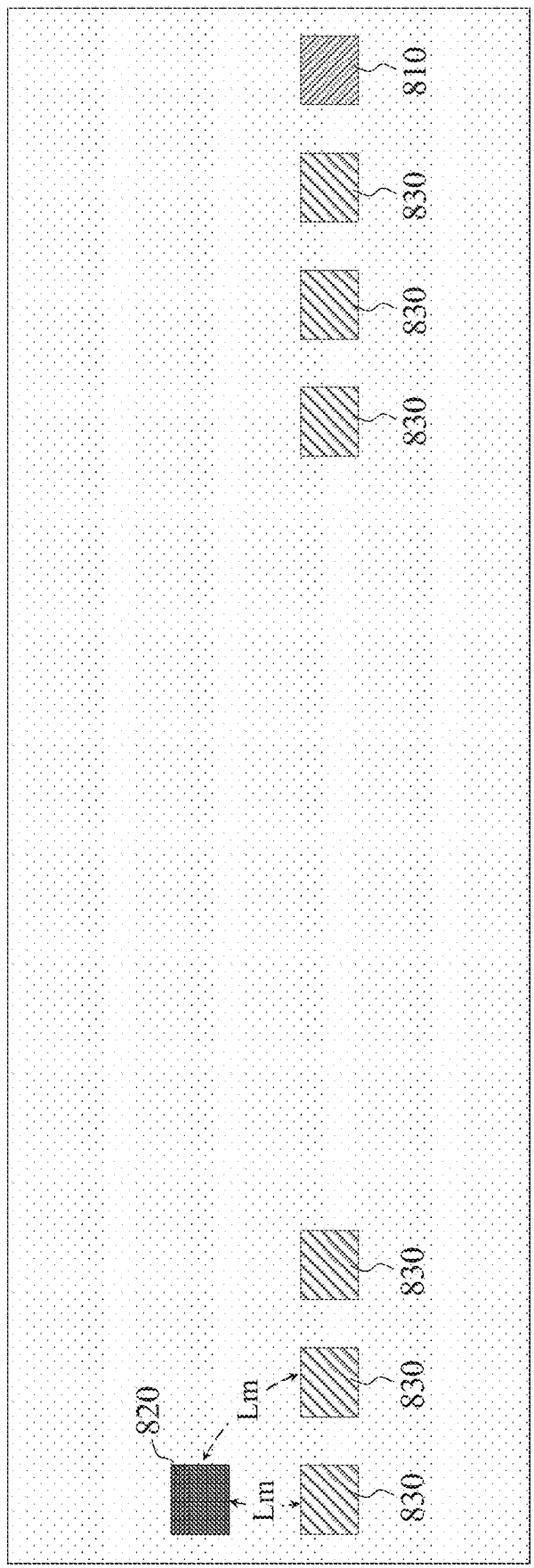
FIG. 8B is a cross-sectional side view B-B of FIG. 8A.

FIG. 8A is a top view or a bottom view of an asymmetric spiral inductor according to an embodiment of the present invention, and FIG. 8B shows the cross-sectional side view B-B of FIG. 8A. Like the asymmetric spiral inductor 400, the asymmetric spiral inductor 800 is also a four-turn structure and includes a winding 810, a winding 820 and a winding 830. The winding 810 and the winding 830 are implemented in the first conductor layer, and the winding 820 is implemented in the second conductor layer. The winding 810, the winding 820 and the winding 830 are connected via the through structure 801 and the through structure 802. More specifically, the through structure 801 connects one end of the winding 820 with the winding 810, and the through structure 802 connects the other end of the winding 820 with the winding 830. The winding 820 extends along the edge of the asymmetric spiral inductor 800 or the winding 830. As a result, the shape of the winding 820 is similar to the partial contour of the asymmetric spiral inductor 800 and/or the winding 830. The end 811 and the end 832 are two ends of the asymmetric spiral inductor 800.

As shown in FIGS. 8A and 8B, a part of the winding 820 overlaps in part with one of the turns of the winding 830 (the outermost turn in this embodiment). There is mutual inductance Lm between the winding 820 and its adjacent winding 830. Please refer to FIGS. 5 to 7, the widths of the traces of the windings 810, 820 and 830 are not limited to the example shown in FIG. 8B.

Figure 9A:
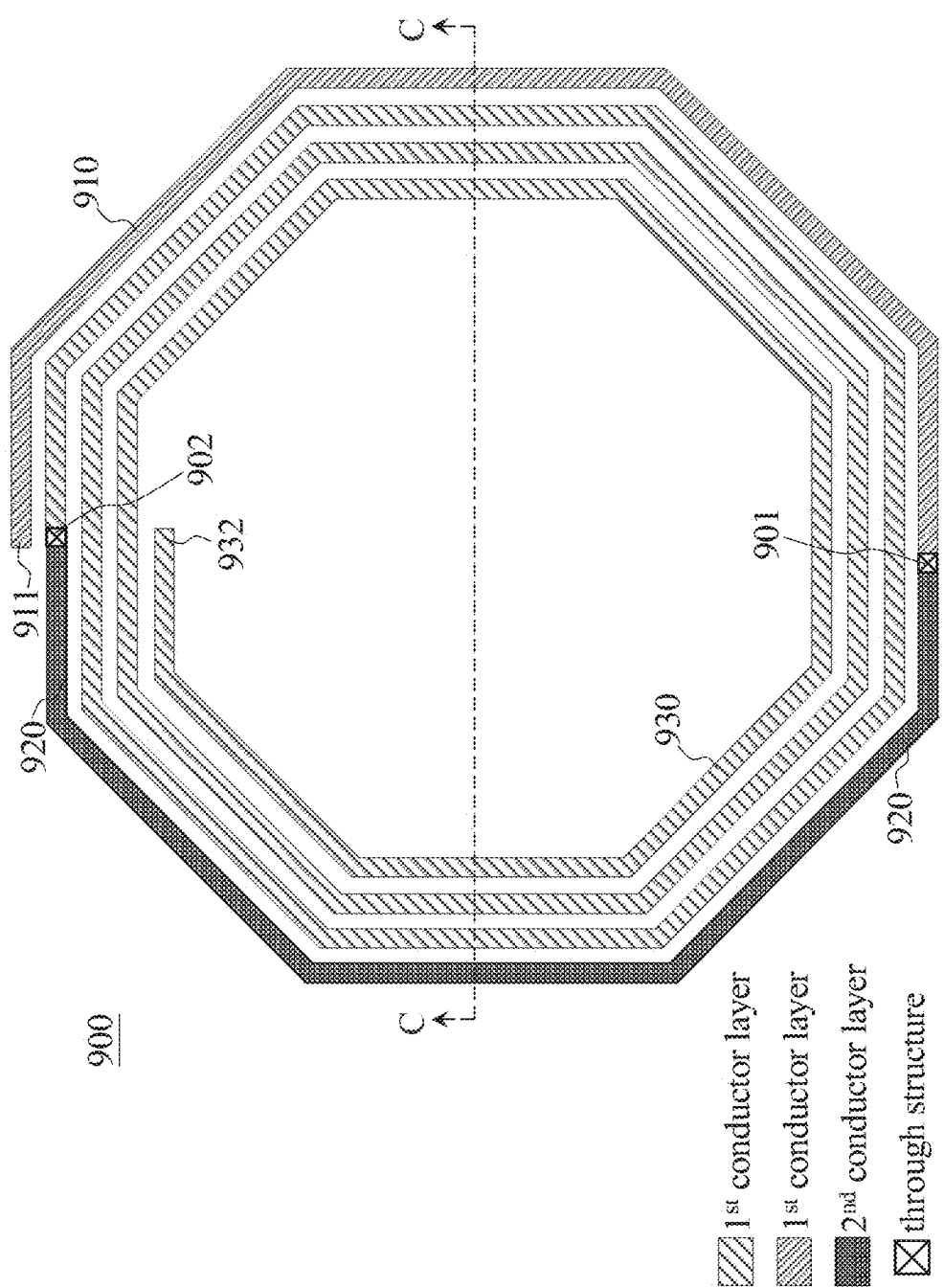
FIG. 9A is an illustrative asymmetric spiral inductor according to another embodiment of the present invention.
Figure 9B:
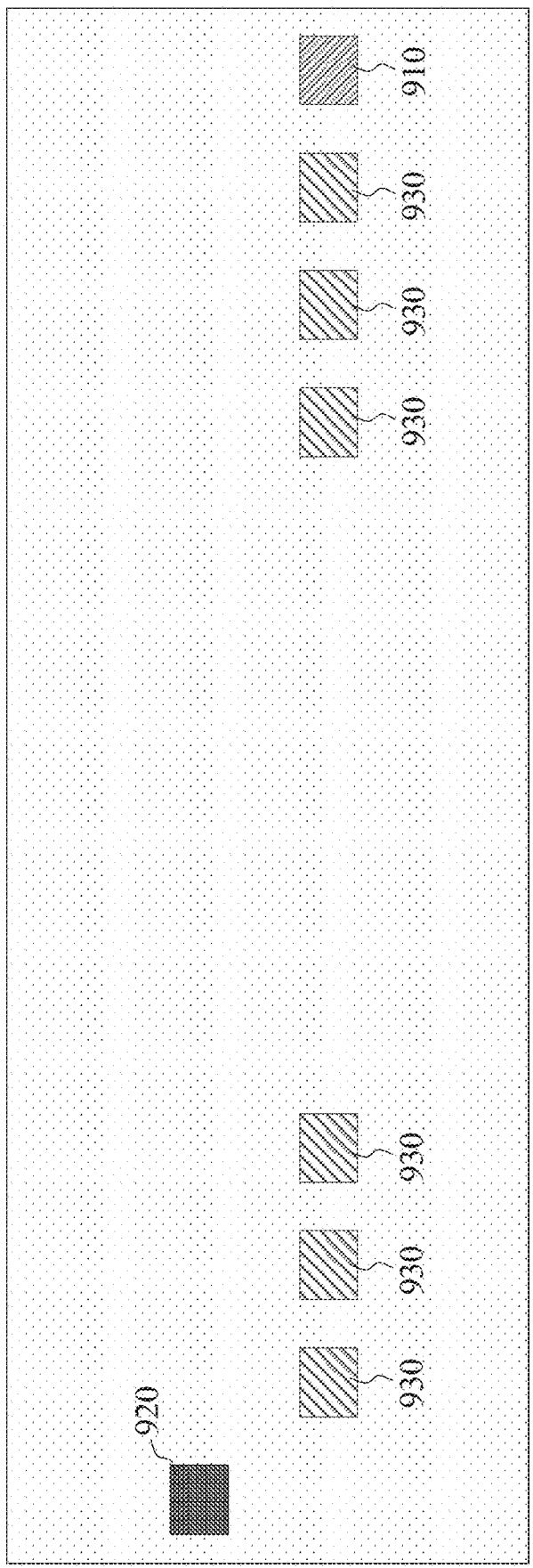
FIG. 9B is the cross-sectional side view C-C of FIG. 9A.

FIG. 9A is a top view or a bottom view of an asymmetric spiral inductor according to another embodiment of the present invention, and FIG. 9B shows the cross-sectional side view C-C of FIG. 9A. Like the asymmetric spiral inductor 400, the asymmetric spiral inductor 900 is also a four-turn structure and includes a winding 910, a winding 920 and a winding 930. The winding 910 and the winding 920 are implemented in the first conductor layer, and the winding 930 is implemented in the second conductor layer. The winding 910, the winding 920 and the winding 930 are connected via the through structure 901 and the through structure 902. More specifically, the through structure 901 connects one end of the winding 920 with the winding 910, and the through structure 902 connects the other end of the winding 920 with the winding 930. The winding 920 extends along the edge of the asymmetric spiral inductor 900 or the winding 930. As a result, the shape of the winding 920 is similar to the partial contour of the asymmetric spiral inductor 900 and/or the winding 930. The end 911 and the end 932 are two ends of the asymmetric spiral inductor 900.

As shown in FIGS. 9A and 9B, the winding 920 does not overlap with the winding 910 and the winding 930. The winding 920 is located at the outermost turn of the asymmetric spiral inductor 900, and the length of the trace of the winding 920 is approximately a half turn of the asymmetric spiral inductor 900 or the winding 930. Please refer to FIGS. 5 to 7, the widths of the traces of the windings 910, 920 and 930 are not limited to the example shown in FIG. 9B.

Figure 10A:
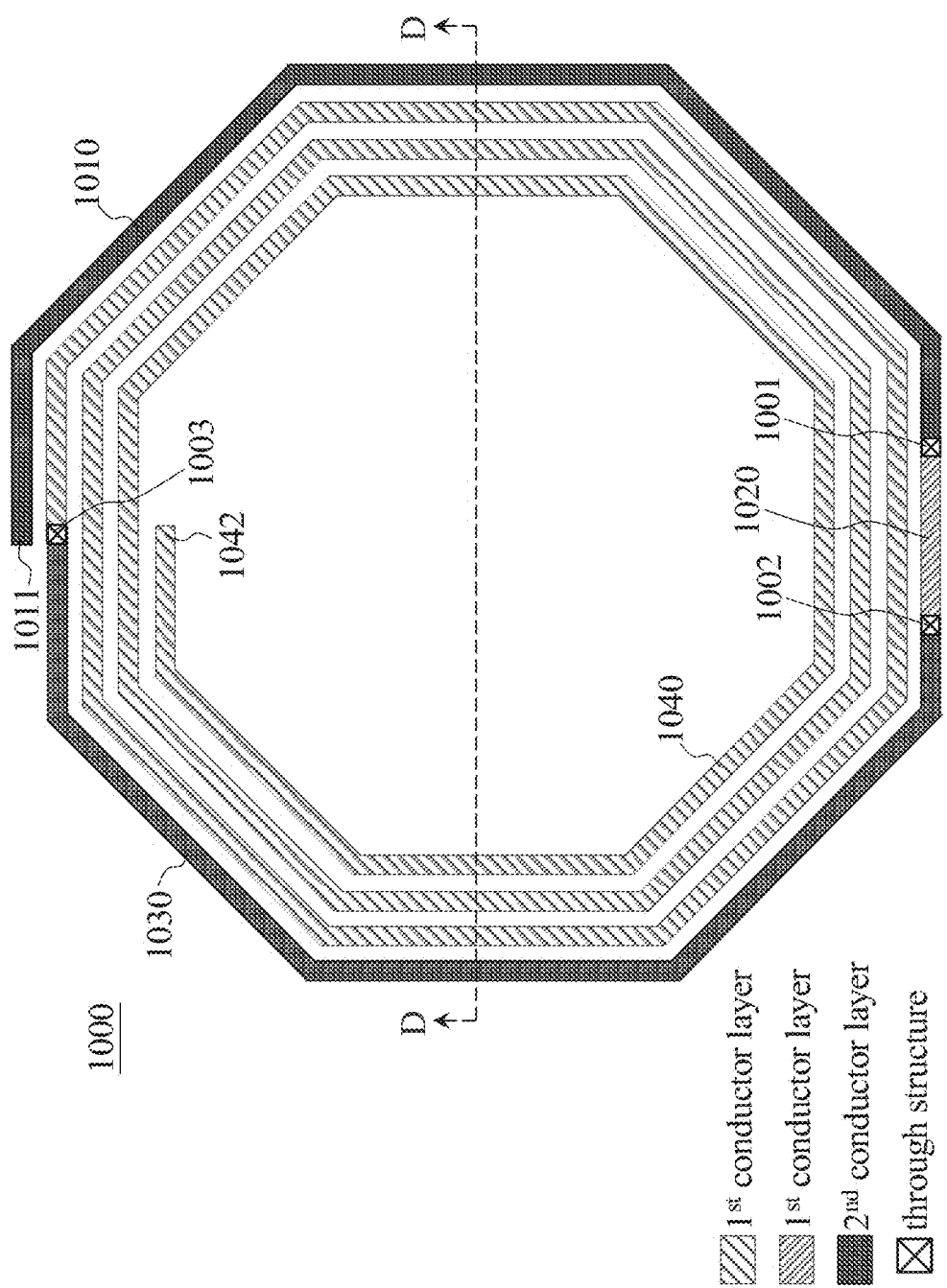
FIG. 10A is an illustrative asymmetric spiral inductor according to another embodiment of the present invention.
Figure 10B:
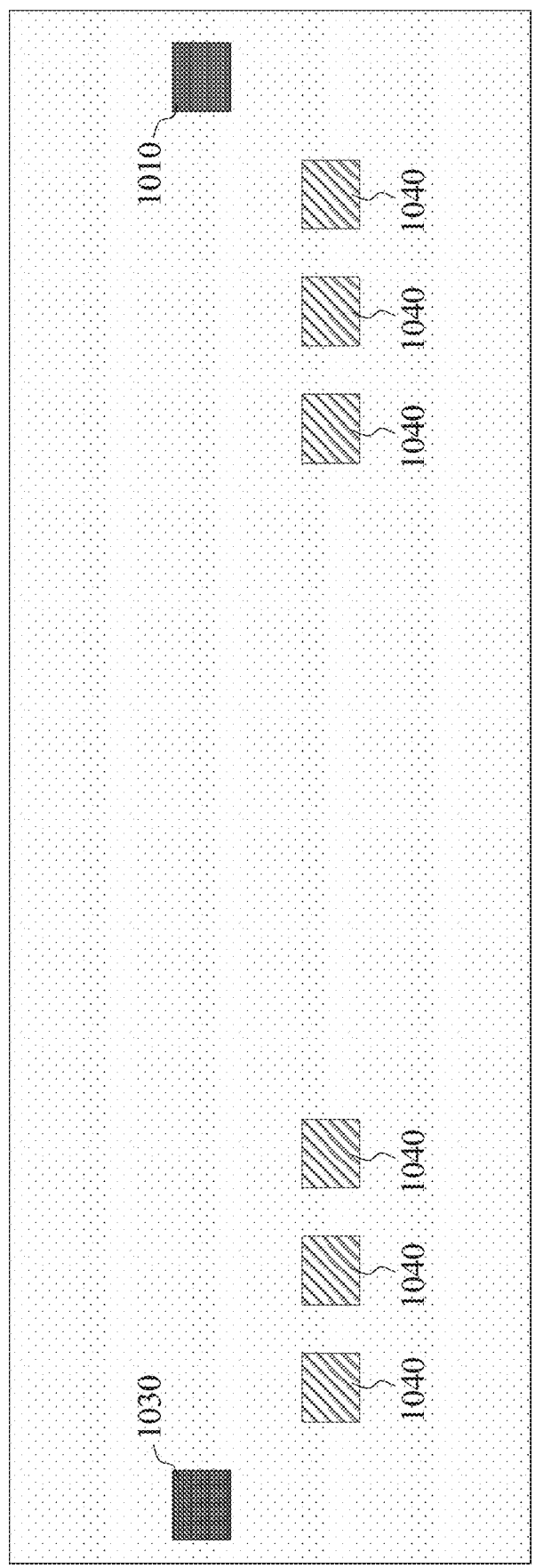
FIG. 10B is the cross-sectional side view D-D of FIG. 10A.

FIG. 10A is a top view or a bottom view of an asymmetric spiral inductor according to another embodiment of the present invention, and FIG. 10B shows the cross-sectional side view D-D of FIG. 10A. Like the asymmetric spiral inductor 400, the asymmetric spiral inductor 1000 is also a four-turn structure and includes a winding 1010, a winding 1020, a winding 1030 and a winding 1040. The winding 1020 and the winding 1040 are implemented in the first conductor layer, and the winding 1010 and the winding 1030 are implemented in the second conductor layer. The winding 1010, the winding 1020, the winding 1030 and the winding 1040 are connected via the through structure 1001, the through structure 1002 and the through structure 1003. The winding 1010 and the winding 1030 extend along the edge of the asymmetric spiral inductor 1000 or the winding 1040. As a result, the shape of the winding 1010 and the shape of the winding 1030 are similar to the partial contour of the asymmetric spiral inductor 1000 and/or the winding 1040. The end 1011 and the end 1042 are two ends of the asymmetric spiral inductor 1000.

As shown in FIGS. 10A and 10B, the winding 1010 and the winding 1030 do not overlap with the winding 1040. The winding 1010 and the winding 1030 are located at the outermost turn of the asymmetric spiral inductor 1000, and the lengths of the trace of the winding 1010 and the trace of the winding 1030 are each approximately a half turn of the asymmetric spiral inductor 1000 or the winding 1040. Please refer to FIGS. 5 to 7, the widths of the traces of the windings 1010, 1020, 1030 and 1040 are not limited to the example shown in FIG. 10B.

Figure 11:
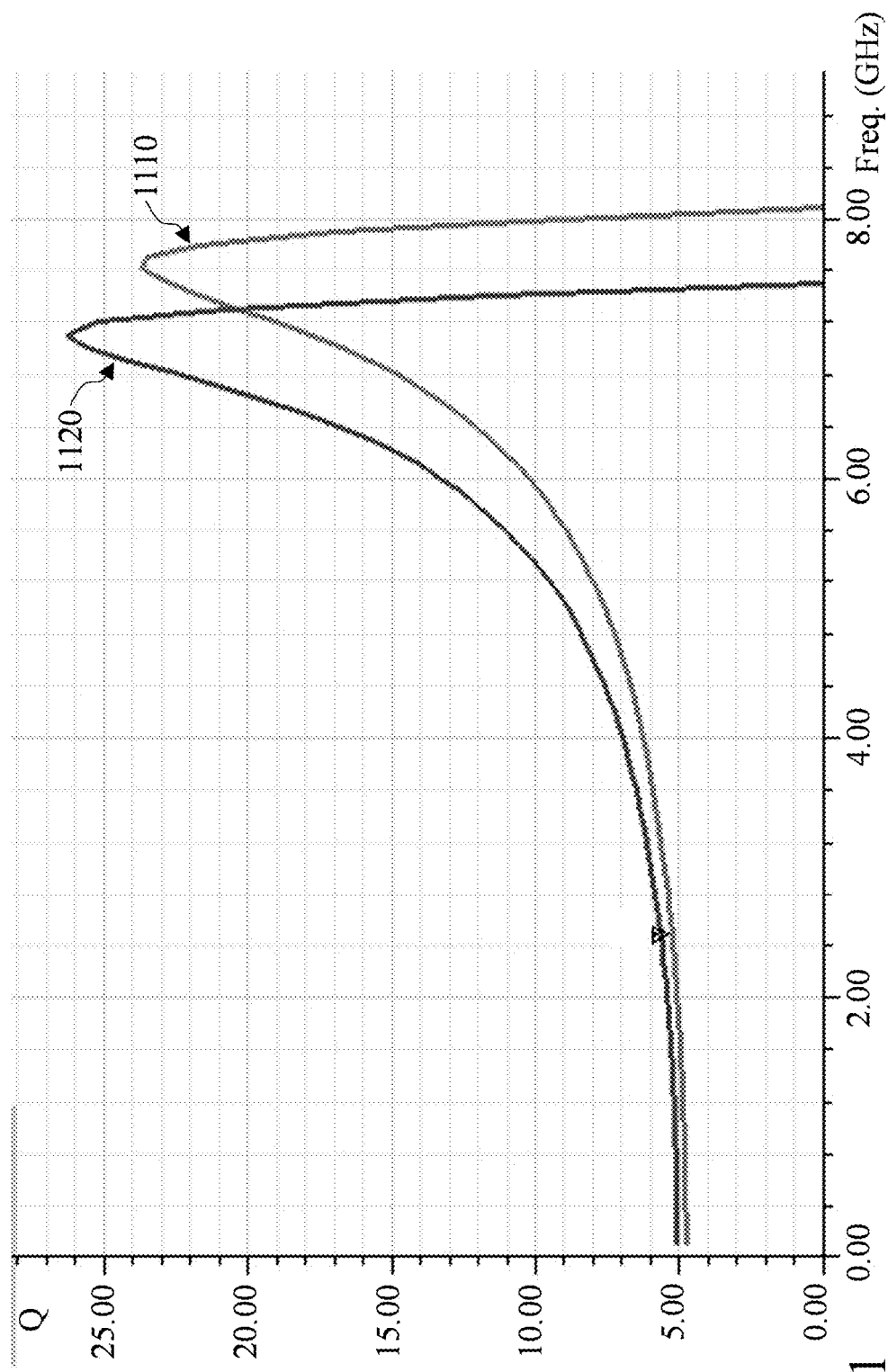
FIG. 11 shows the quality factor Q of the asymmetric spiral inductor 300 and the asymmetric spiral inductor 400.

FIG. 11 shows the quality factor Q of the asymmetric spiral inductor 300 and the asymmetric spiral inductor 400. The curve 1110 represents the quality factor Q of the asymmetric spiral inductor 300, and the curve 1120 represents the quality factor Q of the asymmetric spiral inductor 400. Compared to the asymmetric spiral inductor 300, the structure of the asymmetric spiral inductor 400 can improve the quality factor Q of the inductor.

Although the coils in the embodiments discussed above are of an octagonal shape, the inductors can also be of other polygonal shapes or a circular shape. The inductors of the present invention are not limited to four turns.

In summary, the present invention can increase the inductance value of the asymmetric spiral inductor without increasing the inductor area; therefore the quality factor Q is improved.

Please note that the shape, size, and ratio of any element in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. An asymmetric spiral inductor, comprising:
a first winding, having a first end and a second end and being implemented in an ultra-thick metal (UTM) layer of a semiconductor structure;
a second winding, having a third end and a fourth end, being implemented in a re-distribution layer (RDL) of the semiconductor structure, and having a first maximum trace width; and
a third winding, having a fifth end and a sixth end, being implemented in the UTM layer of the semiconductor structure, and having a second maximum trace width smaller than the first maximum trace width;
wherein the second end and the third end are connected through a first through structure, the fourth end and the fifth end are connected through a second through structure, and the first end and the sixth end are two ends of the asymmetric spiral inductor;
wherein the second winding is located at an outer turn of the asymmetric spiral inductor and does not overlap with the third winding except at the second through structure;
wherein the third winding has at least two turns.

2. The asymmetric spiral inductor of claim 1, wherein a length of the second winding is less than one turn of the asymmetric spiral inductor.

3. The asymmetric spiral inductor of claim 1, wherein a part of the second winding extends along an edge of the third winding.

4. The asymmetric spiral inductor of claim 3, wherein a part of the second winding overlaps with a part of the third winding.

5. The asymmetric spiral inductor of claim 3, wherein a first part of the second winding overlaps with a part of the third winding, and a second part of the second winding overlaps with a part of the first winding and a part of the third winding.

6. The asymmetric spiral inductor of claim 1, wherein the first winding is not a straight line, the second winding is not a straight line and comprises a first segment and a second segment, the first segment is substantially parallel to a first side of the third winding, and the second segment is substantially parallel to a second side of the third winding.

7. An asymmetric spiral inductor, comprising:
a spiral coil, having a first end and a second end and being implemented in a first conductor layer of a semiconductor structure;
a first trace, having a third end and a fourth end and being implemented in a second conductor layer of the semiconductor structure, wherein the first conductor layer is different from the second conductor layer, and a length of the first trace is less than one turn of the spiral coil; and
a second trace, having a fifth end and a sixth end and being implemented in the first conductor layer of the semiconductor structure, wherein the second trace is equal to or less than one turn;
wherein the second end and the third end are connected through a first through structure, the fourth end and the fifth end are connected through a second through structure, and the first end and the sixth end are two ends of the asymmetric spiral inductor;
wherein the spiral coil has at least two turns.

8. The asymmetric spiral inductor of claim 7, wherein the spiral coil has a first maximum trace width, the first trace has a second maximum trace width, and the second maximum trace width is greater than the first maximum trace width.

9. The asymmetric spiral inductor of claim 7, wherein a part of the first trace extends along an edge of the spiral coil.

10. The asymmetric spiral inductor of claim 9, wherein a part of the first trace overlaps with a part of the spiral coil.

11. The asymmetric spiral inductor of claim 9, wherein a first part of the first trace overlaps with a part of the spiral coil, and a second part of the first trace overlaps with a part of the second trace and a part of the spiral coil.

12. The asymmetric spiral inductor of claim 7, wherein the first trace is located at an outer turn of the asymmetric spiral inductor and does not overlap with the spiral coil except at the first through structure.

13. The asymmetric spiral inductor of claim 7, wherein the first trace is not a straight line, the second trace is not a straight line and comprises a first segment and a second segment, the first segment is substantially parallel to a first side of the spiral coil, and the second segment is substantially parallel to a second side of the spiral coil.

14. An asymmetric spiral inductor, comprising:
a first winding, having a first end and a second end and being implemented in an ultra-thick metal (UTM) layer of a semiconductor structure, wherein the first winding is equal to or less than one turn;
a second winding, having a third end and a fourth end, being implemented in a re-distribution layer (RDL) of the semiconductor structure, and having a first maximum trace width; and
a third winding, having a fifth end and a sixth end, being implemented in the UTM layer of the semiconductor structure, and having a second maximum trace width smaller than the first maximum trace width;
wherein the second end and the third end are connected through a first through structure, the fourth end and the fifth end are connected through a second through structure, and the first end and the sixth end are two ends of the asymmetric spiral inductor;
wherein the third winding has at least two turns.

15. The asymmetric spiral inductor of claim 14, wherein a length of the second winding is less than one turn of the asymmetric spiral inductor.

16. The asymmetric spiral inductor of claim 14, wherein a part of the second winding extends along an edge of the third winding.

17. The asymmetric spiral inductor of claim 16, wherein a part of the second winding overlaps with a part of the third winding.

18. The asymmetric spiral inductor of claim 16, wherein a first part of the second winding overlaps with a part of the third winding, and a second part of the second winding overlaps with a part of the first winding and a part of the third winding.

19. The asymmetric spiral inductor of claim 14, wherein the second winding is located at an outer turn of the asymmetric spiral inductor and does not overlap with the third winding except at the second through structure.

20. The asymmetric spiral inductor of claim 14, wherein the first winding is not a straight line, the second winding is not a straight line and comprises a first segment and a second segment, the first segment is substantially parallel to a first side of the third winding, and the second segment is substantially parallel to a second side of the third winding.

* * * * *